(12) United States Patent
Torng et al.

(10) Patent No.: US 10,546,234 B2
(45) Date of Patent: *Jan. 28, 2020

(54) BUFFER MEMORY ARCHITECTURE FOR A CNN BASED PROCESSING UNIT AND CREATION METHODS THEREOF

(71) Applicant: GYRFALCON TECHNOLOGY INC., Milpitas, CA (US)

(72) Inventors: Chyu-Jiuh Torng, Dublin (IE); Lin Yang, Milpitas, CA (US); Qi Dong, San Jose, CA (US)

(73) Assignee: Gyrfalcon Technology Inc., Milpitas, CA (US)

( * ) Notice: Subject to any disclaimer, the term of this patent is extended or adjusted under 35 U.S.C. 154(b) by 395 days.

This patent is subject to a terminal disclaimer.

(21) Appl. No.: 15/498,378

(22) Filed: Apr. 26, 2017

(65) Prior Publication Data

US 2018/0285713 A1 Oct. 4, 2018

Related U.S. Application Data

(63) Continuation-in-part of application No. 15/477,263, filed on Apr. 3, 2017, now Pat. No. 10,331,367.

(51) Int. Cl.
*G06N 3/04* (2006.01)
*G06N 3/063* (2006.01)
*G06F 13/16* (2006.01)
*G06F 3/06* (2006.01)
*G11C 11/16* (2006.01)

(52) U.S. Cl.
CPC ............ *G06N 3/063* (2013.01); *G06F 3/0629* (2013.01); *G06F 13/16* (2013.01); *G06N 3/04* (2013.01); *G11C 11/161* (2013.01)

(58) Field of Classification Search
CPC ...... G06F 3/0629; G06F 3/0688; G06F 3/061; G06F 13/4068; G06F 13/16; G06N 3/04; G11C 11/161; H01L 43/08; H01L 27/222; H01L 43/12

See application file for complete search history.

(56) References Cited

U.S. PATENT DOCUMENTS 5,355,528 A * 10/1994 Roska .................. G06N 3/0635
706/38
5,717,834 A 2/1998 Werblin et al.
(Continued)

OTHER PUBLICATIONS

USPTO notice of allowance for U.S. Appl. No. 15/632,203 (related case) dated Mar. 25, 2019.
(Continued)

*Primary Examiner* — Khamdan N. Alrobaie

(57) ABSTRACT

CNN based digital IC for AI contains a number of CNN processing units. A first CNN processing unit contains CNN logic circuits operatively coupling to a memory subsystem, which includes a first one-time-programming (OTP) memory for filter coefficients and a second memory for imagery data. A second CNN processing unit contains CNN logic circuits operatively coupling to a memory subsystem that includes a first memory for filter coefficients, a second memory for imagery data and a third OTP memory for unique data pattern (e.g., security purpose). Either STT-RAM or OST-MRAM can be configured as different memories of the memory subsystem.

10 Claims, 11 Drawing Sheets

(56) References Cited

U.S. PATENT DOCUMENTS

| | | | |
|---|---|---|---|
| 7,884,433 B2 | 2/2011 | Zhong et al. | |
| 8,183,061 B2 | 5/2012 | Zhong et al. | |
| 8,324,698 B2 | 12/2012 | Zhong et al. | |
| 8,772,051 B1 | 7/2014 | Zhong et al. | |
| 8,803,293 B2 | 8/2014 | Zhong et al. | |
| 8,933,542 B2 | 1/2015 | Zhong et al. | |
| 9,111,222 B2 * | 8/2015 | Aparin | G06N 3/0472 |
| 9,166,143 B1 | 10/2015 | Gan et al. | |
| 9,437,272 B1 | 9/2016 | Lu et al. | |
| 9,673,388 B2 | 6/2017 | Toh et al. | |
| 9,685,604 B2 | 6/2017 | Huang et al. | |
| 9,734,880 B1 | 8/2017 | Augustine et al. | |
| 9,767,557 B1 | 9/2017 | Gulsun et al. | |
| 9,940,534 B1 | 4/2018 | Yang et al. | |
| 9,959,500 B1 | 5/2018 | Torng et al. | |
| 10,049,322 B2 | 8/2018 | Ross | |
| 2007/0047294 A1 * | 3/2007 | Panchula | B82Y 25/00 365/158 |
| 2011/0273926 A1 * | 11/2011 | Wu | G11C 11/16 365/158 |
| 2012/0294076 A1 | 11/2012 | Lee et al. | |
| 2012/0294078 A1 | 11/2012 | Kent et al. | |
| 2014/0071741 A1 * | 3/2014 | Kim | G11C 11/16 365/158 |
| 2017/0039472 A1 | 2/2017 | Kudo | |
| 2017/0103298 A1 | 4/2017 | Liang et al. | |
| 2017/0103299 A1 | 4/2017 | Aydonat et al. | |
| 2018/0137414 A1 | 5/2018 | Du et al. | |
| 2018/0315473 A1 | 11/2018 | Jung et al. | |

OTHER PUBLICATIONS

USPTO office action for U.S. Appl. No. 15/632,203 (related case) dated Feb. 26, 2019.
USPTO notice of allowance for U.S. Appl. No. 15/477,263 (parent case) dated Mar. 11, 2019.
USPTO notice of allowance for U.S. Appl. No. 15/591,069 (related case) dated Mar. 14, 2019.
Zhao et al. "Design of MRAM based Logic Circuits and its Applications", Proceeding GLSVLSI '11 Proceedings of the 21st edition of the great lakes symposium on Great lakes symposium on VLSI pp. 431-436 Lausanne, Switzerland—May 2-4, 2011.
Kodzuka et al. "Effects of boron composition on tunneling magnetoresistance ratio and microstructure of CoFeB/MgO/CoFeB pseudo-spin-valve magnetic tunnel junctions", Journal of Applied Physics 111, 043913 (2012).
Sze et al. "Hardware for Machine Learning: Challenges and Opportunities", Published at an invited conference paper at CICC 2017, Submitted on Dec. 22, 2016 (v1).
L. Thomas et al. "Basic Principles, Challenges and Opportunities of STT-MRAM for Embedded Memory Applications" MSST 2017—Santa Clara, May 17, 2017.
Kultursay et al. "Evaluating STT-RAM as an Energy-Efficient Main Memory Alternative", Published in: Performance Analysis of Systems and Software (ISPASS), 2013 IEEE International Symposium, Apr. 21-23, 2013.
USPTO office action for U.S. Appl. No. 15/591,069 (related case) dated Sep. 7, 2018.
USPTO office action for U.S. Appl. No. 15/632,203 (related case) dated Sep. 20, 2018.
USPTO office action for U.S. Appl. No. 15/477,263 (Parent case) dated Sep. 7, 2018.

* cited by examiner

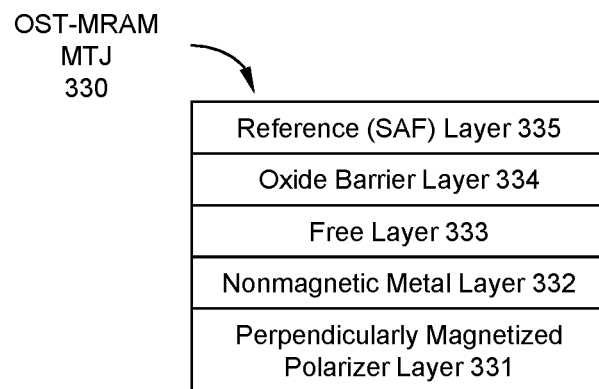
FIG. 3E
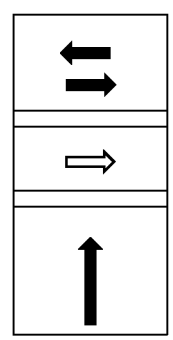 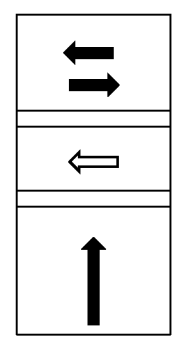
FIG. 3F          FIG. 3G

800

| Target Material | Yield @ 600 ev | Sputtering Rate* (Å/sec) |
|---|---|---|
| Ag | 3.4 | 380 |
| Al | 1.2 | 170 |
| Au | 2.8 | 320 |
| Cr | 1.3 | 180 |
| Ir | 1.2 | 135 |
| Mg | 1.4 | 200 |
| Mo | 0.9 | 120 |
| Nb | 0.6 | 80 |
| Ru | 1.3 | 180 |
| Ta | 0.6 | 85 |
| Ti | 0.6 | 80 |
| TiN |  | 40 |
| W | 0.6 | 80 |
| Zr | 0.7 | 85 |

FIG. 8

BUFFER MEMORY ARCHITECTURE FOR A CNN BASED PROCESSING UNIT AND CREATION METHODS THEREOF

CROSS-REFERENCE TO RELATED APPLICATIONS

This application is a continuation-in-part (CIP) of a co-pending U.S. patent application Ser. No. 15/477,263, entitled "Embedded Memory Subsystems For A CNN Based Processing Unit And Methods Of Making" filed on Apr. 3, 2017. The contents of which are hereby incorporated by reference in its entirety for all purposes.

FIELD

The invention generally relates to the field of integrated circuit and more particularly to buffer memory architecture configured for a CNN based processing unit and creation methods thereof.

BACKGROUND

Artificial Intelligence (AI) is defined as intelligence exhibited by machines (e.g., computers, processors, etc.). Intelligence means the ability to acquire and apply knowledge and skills. Many different approaches have been tried and tested in AI research since 1960s. One of the more promising techniques is based on Cellular Neural Networks or Cellular Nonlinear Networks (CNN). CNN have been applied to many different fields and problems including, but limited to, image processing, speech recognition, etc. However, most of the prior art CNN approaches are either based on software solutions (e.g., Convolutional Neural Networks, Recurrent Neural Networks, etc.) or based on hardware that are designed for other purposes (e.g., graphic processing, general computation, etc.). As a result, CNN prior approaches are too slow in term of computational speed and/or too expensive thereby impractical for processing large amount of imagery data. The imagery data can be from any two-dimensional signals (e.g., a still photo, a picture, a frame of a video stream, etc.).

For a CNN based IC for artificial intelligence, data must be provided as close to the CNN processing logic. In addition, different characteristics of data may be required. For example, in image processing, filter coefficients and imagery data have different requirements. Filter coefficients need to be validly stored for long time, while the imagery data are written and read more often.

Prior art approaches have problems and shortfalls. For example, SRAM (Static RAM) was used for storing imagery data. Flash memory was used for storing filter coefficients. However, integrating different memory technologies/types on a single silicon chip is not practical and the power consumption is too high. Furthermore, security of a CNN based IC would be a concern, since increasing numbers of mission critical applications may be based on such an IC.

SUMMARY

This section is for the purpose of summarizing some aspects of the invention and to briefly introduce some preferred embodiments. Simplifications or omissions in this section as well as in the abstract and the title herein may be made to avoid obscuring the purpose of the section. Such simplifications or omissions are not intended to limit the scope of the invention.

For a CNN processing unit for either mobile co-processor or servo co-processor for processing large amount of input signals (e.g., imagery data, voice data, etc.) Processing-in memory or memory-in processor are the most promising approach. Together with low power consumption, read/write speed and highly distributed on the same silicon are the three major requirements.

Buffer memory architecture configured for a CNN based processing unit and methods of creation are disclosed.

According to one aspect, a CNN based digital IC for AI contains a number of CNN processing units. Each CNN processing unit comprises CNN logic circuits operatively coupling to a memory subsystem that includes a first memory configured for storing filter coefficients, a second memory configured for storing imager data and a third one-time-programming (OTP) memory configured for storing a unique data pattern for security purpose. All three memories made of either STT-RAM or OST-MRAM can be fabricated on a same silicon. OTP memory can be created during various stages of fabrication or use of the IC.

According to another aspect, a CNN based digital IC for AI contains a number of CNN processing units. Each CNN processing unit comprises CNN logic circuits operatively coupling to a memory subsystem that includes a first OTP memory configured for storing substantially permanent filter coefficients and a second memory configured for storing imager data. Both memories made of either STT-RAM or OST-MRAM can be fabricated on a same silicon.

In order to create OTP memory, one method is to break down oxide barrier of the MTJ element in either STT-RAM or OST-MRAM cell. To break down the oxide barrier layer of a MTJ element for creating OTP memory, a number of techniques are used:
(a) applying an electric voltage higher than normal read/write voltage (a range of 100-700 mV (millivolts)) during fabrication or use;
(b) applying an electric current longer than normal read/write time or duty cycle of 5 ns (nanoseconds) during fabrication or use;
(c) setting different size of MTJ elements (bits) in a range of 20 nm to 150 nm during fabrication, the smaller size of MTJ element is easier for an oxide barrier layer to be broken down; and
(d) setting different cell size such that different gate length of transistors can be used during fabrication, a larger transistor would provide larger electric current. The preferred gate length of a transistor is between 50 nm to 280 nm for 28 nm semiconductor technology.

Furthermore, the aforementioned techniques are used alone or in any combinations, for example, (a) and (c), (a) and (d), (c) and (d), (b), (c) and (d), and the likes.

Other objects, features, and advantages of the invention will become apparent upon examining the following detailed description of an embodiment thereof, taken in conjunction with the attached drawings.

BRIEF DESCRIPTION OF THE DRAWINGS

These and other features, aspects, and advantages of the invention will be better understood with regard to the following description, appended claims, and accompanying drawings as follows:

FIGS. 3E-3G are diagrams showing various features of an example Orthogonal Spin Transfer Magnetic RAM (OST-MRAM) being used for forming a memory subsystem, according to an embodiment of the invention;

FIG. 8 is table summarizes properties of example materials that can be used in high selectivity layer during fabrication of the embedded memory subsystem of the CNN based IC for artificial intelligence, according to an embodiment of the invention.

DETAILED DESCRIPTIONS

In the following description, numerous specific details are set forth in order to provide a thorough understanding of the invention. However, it will become obvious to those skilled in the art that the invention may be practiced without these specific details. The descriptions and representations herein are the common means used by those experienced or skilled in the art to most effectively convey the substance of their work to others skilled in the art. In other instances, well-known methods, procedures, and components have not been described in detail to avoid unnecessarily obscuring aspects of the invention.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments mutually exclusive of other embodiments. Further, the order of blocks in process flowcharts or diagrams or circuits representing one or more embodiments of the invention do not inherently indicate any particular order nor imply any limitations in the invention. Used herein, the terms "vertical", "horizontal", "planar", "parallel", "anti-parallel", "perpendicular", "plan", "elevation" are intended to provide relative positions for the purposes of description, and are not intended to designate an absolute frame of reference. Additionally, term "MTJ element" and "MTJ bit" are interchangeable.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Embodiments of the invention are discussed herein with reference to FIGS. 1-8. However, those skilled in the art will readily appreciate that the detailed description given herein with respect to these figures is for explanatory purposes as the invention extends beyond these limited embodiments.

Figure 1:
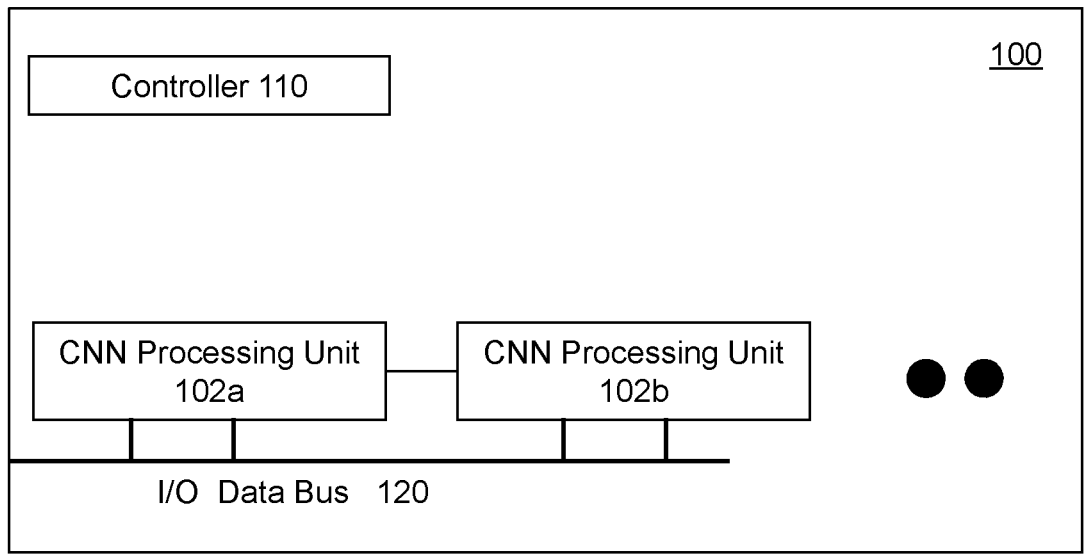
FIG. 1 is a block diagram illustrating an example CNN based IC for artificial intelligence in accordance with one embodiment of the invention.

Referring first to FIG. 1, it is shown a block diagram illustrating an example CNN based digital integrated circuit (IC) for artificial intelligence 100 for artificial intelligence (e.g., image processing, voice reorganization, etc.) in accordance with one embodiment of the invention.

The IC 100 is implemented as a digital semi-conductor chip (e.g., a silicon substrate) and contains a controller 110, and a plurality of CNN processing units 102a-102b operatively coupled to at least one input/output (I/O) data bus 120. Controller 110 is configured to control various operations of the CNN processing units 102a-102b, which are connected in a loop with a clock-skew circuit.

In one embodiment, the digital integrated circuit 100 is extendable and scalable. For example, multiple copy of the digital integrated circuit 100 can be implemented on a single semi-conductor chip.

Figure 2A:
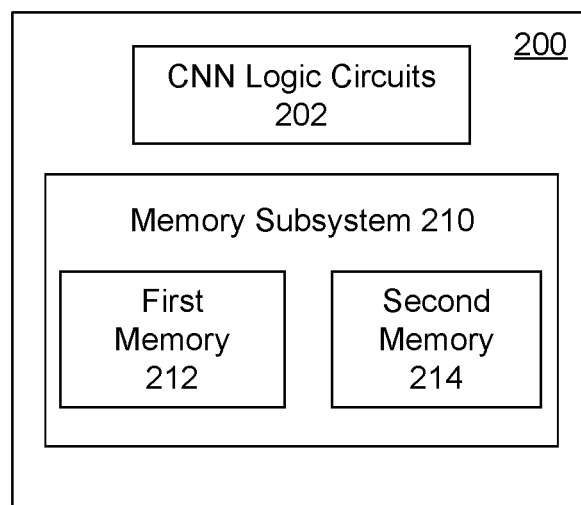
FIG. 2A is a function block diagram showing an example CNN processing unit including a first example memory subsystem according to an embodiment of the invention.

All of the CNN processing units are identical. For illustrating simplicity, function block diagram of an example CNN processing unit 200 is shown in FIG. 2A. The invention sets no limit to the number of CNN processing units on a digital semi-conductor chip.

Each CNN processing unit 200 contains CNN logic circuits 202, which is operatively coupled to an embedded memory subsystem 210. In other words, the memories of the embedded memory subsystem 210 and the CNN logic circuits 202 are located on the same digital semi-conductor chip. In one embodiment, CNN logic circuits 202 are configured for performing convolution operations of input signals with filter coefficients (or weights). In one embodiment, the input signals are imagery data. In another embodiment, the input signals are converted voice data.

Memory subsystem 210 is made of a first memory 212 and a second memory 214. The first memory 212 is configured for requiring data being stored with higher retention rate than the second memory 214. The second memory 214 is configured for higher endurance of balanced data read and write operations than the first memory 212. In one embodiment, the first memory 212 is for storing filter coefficients while the second memory 214 is for storing imagery data in an image processing application.

The first memory 212 contains an array of first spin transfer torque magnetic random access memory (STT-RAM) cells with each first STT-RAM cell containing a first magnetic tunnel junction (MTJ) element. The second memory 214 contains an array of second STT-RAM cells with each second STT-RAM cell containing a second MTJ element. In one embodiment, the first MTJ element and the second MTJ element are made of identical layers except their respective planar areas. The first MTJ element has a first circular planar area, which has a first diameter in a range of 40-120 nm (nanometer). The second MTJ element has a second circular planar area, which has a second diameter in a range of 30-75 nm. It is noted that the first memory 212 is configured for storing weights or filter coefficients while the second memory 214 is configured for storing input signals or imagery data.

In an alternative embodiment, the first memory 212 contains an array of first orthogonal spin transfer magnetic memory (OST-MRAM) cells while the second memory 214 contains an array of second OST-MRAM cells. Each OST-MRAM also contains an MTJ, which has a different structure than that of the MTJ of STT-RAM. The details are shown in FIGS. 3E-3G.

Figure 2B:
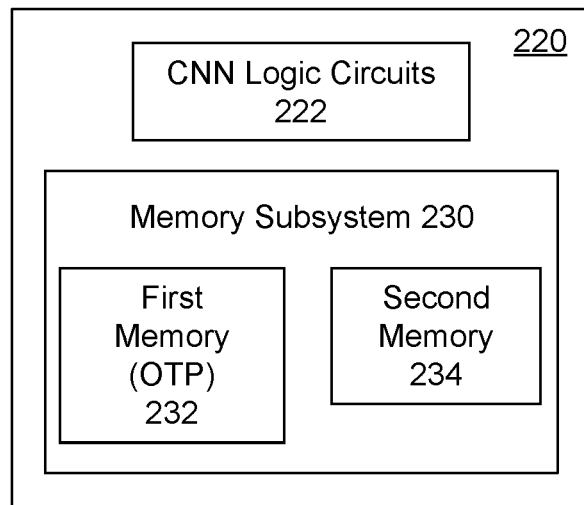
FIG. 2B is a function block diagram showing another example CNN processing unit including a second example memory subsystem according to an embodiment of the invention.

FIG. 2B shows another example CNN processing unit 220, which contains CNN logic circuits 222 operatively coupling to a memory subsystem 230. The memory subsystem 230 includes a first one-time-programming (OTP) memory 232 and a second memory 234. The first OTP memory 232 is configured for storing filter coefficients or weights that are stored once and never changed. In other words, one specific set of filters are stored in the memory subsystem of respective CNN processing units of a CNN based digital IC for AI, which is designed for performing one specific task (e.g., extracting a particular feature of an image such as traffic signal recognition, lane keeping, etc.). The second memory 234 is configured for storing imagery data, which requires frequent read/write operations. Both the first OTP memory 232 and the second memory 234 can be made of either STT-RAM or OST-MRAM cells.

Figure 2C:
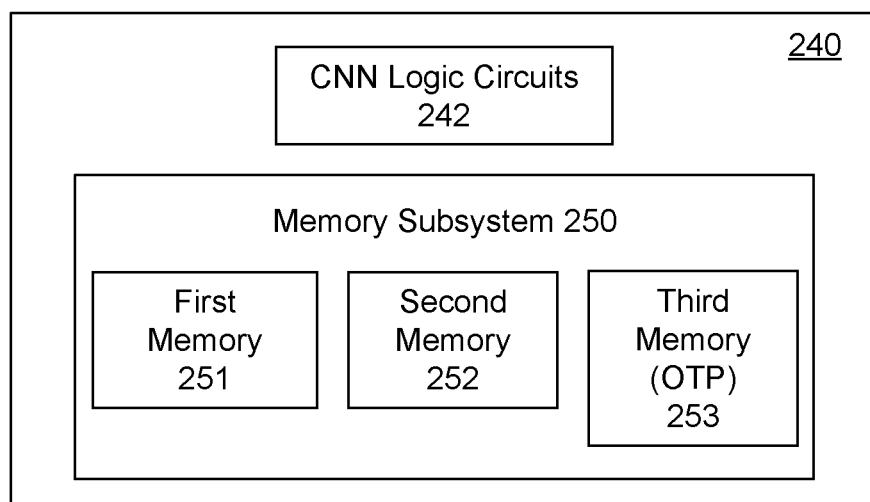
FIG. 2C is a function block diagram showing yet another example CNN processing unit including a third example memory subsystem according to an embodiment of the invention.

In another embodiment shown in FIG. 2C, a CNN processing unit 240 comprises CNN logic circuits 242 operatively coupling to a memory subsystem 250. The memory subsystem 250 contains a first memory 251, a second memory 252 and a third OTP memory 253. The first memory 251 is configured for storing filter coefficients and the second memory 252 is configured for storing imagery data substantially similar to the CNN processing unit 200 of FIG. 2A. The third OTP memory 253 can be used for other purposes (e.g., a unique pattern for security). In order for all three types of memory coexisted on a same silicon, first, second and third memories 251-253 can be made of either STT-RAM or OST-RAM cells.

For OTP memory (i.e., the first OTP memory 232 in FIG. 2B or the third OTP memory 253 in FIG. 2C), the diameter of planar circular area of MTJ has a range of 20-120 nm.

Figure 3A:
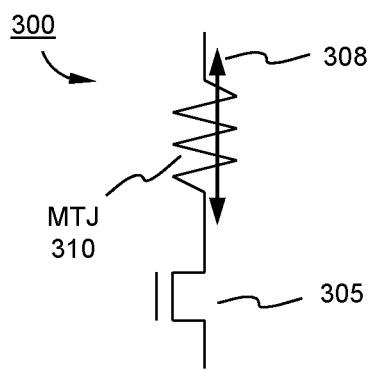
FIGS. 3A-3D are diagrams showing various features of an example STT-RAM being used for forming a memory subsystem, according to an embodiment of the invention.

FIG. 3A is a schematic diagram showing components of an example STT-RAM cell 300. Each STT-RAM cell 300 contains one transistor 305 and one MTJ (Magnetic Tunnel Junction) element 310 located between source line (SL), bit line (BL) and word line (WL). A spin-polarized electric current 308 (shown as an arrow) is used for controlling (i.e., reading and writing) the state of MTJ element 310. In one embodiment, MTJ element operates in a Current Perpendicular to Plane configuration. This also referred to as perpendicular MTJ (PMTJ) element.

Figure 3B:
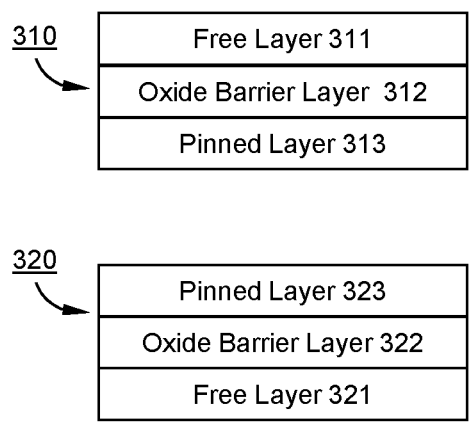

FIG. 3B shows a first MTJ element 310 contains two ferromagnetic layers 311 and 313 located on either side of an oxide barrier layer 312. The first ferromagnetic layer's magnetization direction is switchable by the spin-polarized electric current, while the second ferromagnetic layer's magnetization direction is fixed and can provide the spin-polarized electric current for switching. Therefore, the first ferromagnetic layer is referred to as a free layer 311 and the second ferromagnetic layer is referred to as a pinned or fixed magnetic layer 313. The relative direction of magnetization of free layer 311 and pinned layer 313 gives two different states (i.e., zero and one) of MTJ element 310.

In an alternative embodiment, the three layers of a second MTJ element 320 is reversely arranged from the first MTJ element 310. In the second MTJ element 320, the top layer is pinned layer 323 and the bottom layer is free layer 321. The oxide barrier layer 322 is located in between.

Figure 3C:
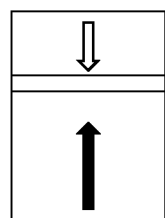
Figure 3D:
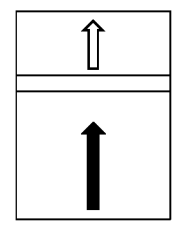

FIG. 3C shows an MTJ element having different magnetization directions (i.e., arrows having different directions) in free layer 311 and in pinned layer 313, while FIG. 3D shows two layers having the same magnetization directions. In one embodiment, state "1" and state "0" are assigned to respective configurations in FIG. 3C and FIG. 3D.

STT-RAM cell uses a spin-polarized electric current 308 to write only to MTJ element that needs state changes. MTJ element magnetization switching occurs due to a transfer of angular momentum between the spins within the local magnetic moment and electrons passing through the MTJ element 310.

FIG. 3E is a diagram showing an example MTJ element 330 of OST-MRAM. The OST-MRAM MTJ element 330 contains five layers: perpendicularly magnetized polarizer layer 331, nonmagnetic metal layer 332 (e.g., copper coupling layer), free layer 333, oxide barrier layer 334 and reference layer 335 (e.g., SAF (synthetic anti-ferromagnetic) layer). Two different states (i.e., anti-parallel shown in FIG. 3F and parallel shown in FIG. 3G) represent "1" and "0". Magnetization direction in polarizer layer 331 is perpendicular to the horizontal plane of the MTJ element 330, while respective magnetization directions in free layer 333 and in reference layer 335 are parallel to the horizontal plane. Instead of having a circular shape for the STT-RAM MTJ element 310, the OST-MRAM MTJ element 330 has a different shape (e.g., elliptical shape 471 shown in FIG. 4C.

Other types of memory technology having substantially similar characteristics of STT-RAM or OST-MRAM cell may be used for forming memory cells in a memory subsystem for a CNN based digital IC for artificial intelligence.

Figure 3H:
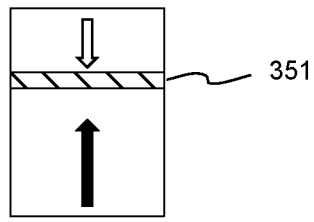
FIGS. 3H-3K are diagrams showing various example MTJs with a broken-down oxide barrier, according to an embodiment of the invention.
Figure 3I:
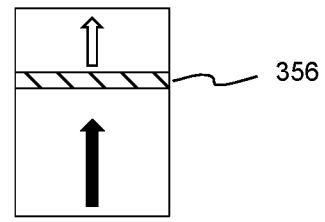
Figure 3J:
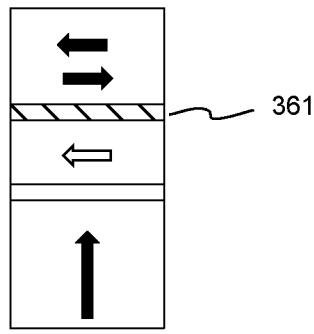
Figure 3K:
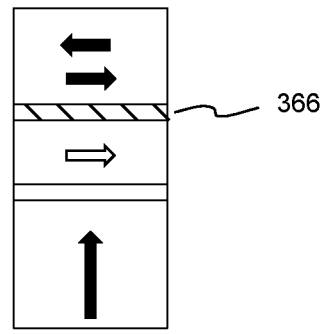

In order to create OTP memory, one method is to break down the oxide barrier of MTJ element in either STT-RAM or OST-MRAM cell. FIGS. 3H-3I show STT-RAM MTJ element with respective broken-down barriers 351 and 356 for anti-parallel and parallel configurations. FIGS. 3J and 3K show anti-parallel and parallel configurations of respective MTJ elements of an example OST-MRAM having corresponding oxide barrier layer 361, 366 broken down.

OTP is referred to data being written to memory only one time (e.g., substantially permanent once written). For either STT-RAM cell or OST-MRAM cell, OTP can be performed in many stages: wafer level, chip level, after soldering during fabrication of a CNN based digital IC. For example, a specific application such as face recognition requires a particular set of filter coefficients, which can be OTP to IC (i.e., first OTP memory 232 of FIG. 2B) during fabrication. Or a specific usage (e.g., security for certain application or user), the data can be OTP to IC (i.e., third OTP memory 253).

OTP can also be performed after fabrication during use, for example, a specific pattern unique to any application and any user is created and programmed (i.e., written) to the OTP memory in an initialization procedure or first use. In one embodiment, one user can OTP a particular set of filter coefficients to IC (i.e., the first OTP memory 232 of FIG. 2B) for one application, while another user can OTP a different set of filter coefficients for another application. In another embodiment, a unique pattern of data (e.g., user data such as user identification, name, number, fingerprint, etc.) can be OTP to IC (i.e., third OTP memory 253 of FIG. 2C) during use.

To break down the oxide barrier layer of a MTJ element for creating OTP memory, a number of techniques are used:
(a) applying an electric voltage higher than normal read/write voltage (a range of 100-700 mV (millivolts)) during fabrication or use;
(b) applying an electric current longer than normal read/write time or duty cycle of 5 ns (nanoseconds) during fabrication or use;
(c) setting different size of MTJ elements (bits) in a range of 20-150 nm in diameter during fabrication, the smaller size of MTJ element is easier for an oxide barrier layer to be broken down; and
(d) setting different cell size such that different gate length of transistors can be used during fabrication, a larger transistor would provide larger electric current. The preferred gate length of a transistor is between 50 nm to 280 nm for 28 nm semiconductor technology.

Furthermore, the aforementioned techniques can be used alone or in any combinations, for example, (a) and (c), (a) and (d), (c) and (d), (b), (c) and (d), and the likes.

Applying larger electric voltage can be achieved by a larger transistor 305 of FIG. 3A. Applying longer electric current 308 through an MTJ element 310. An example of different sizes of MTJ elements is shown in FIG. 4A, while different cell size (i.e. different pitch) is shown in FIG. 4B.

Figure 4A:
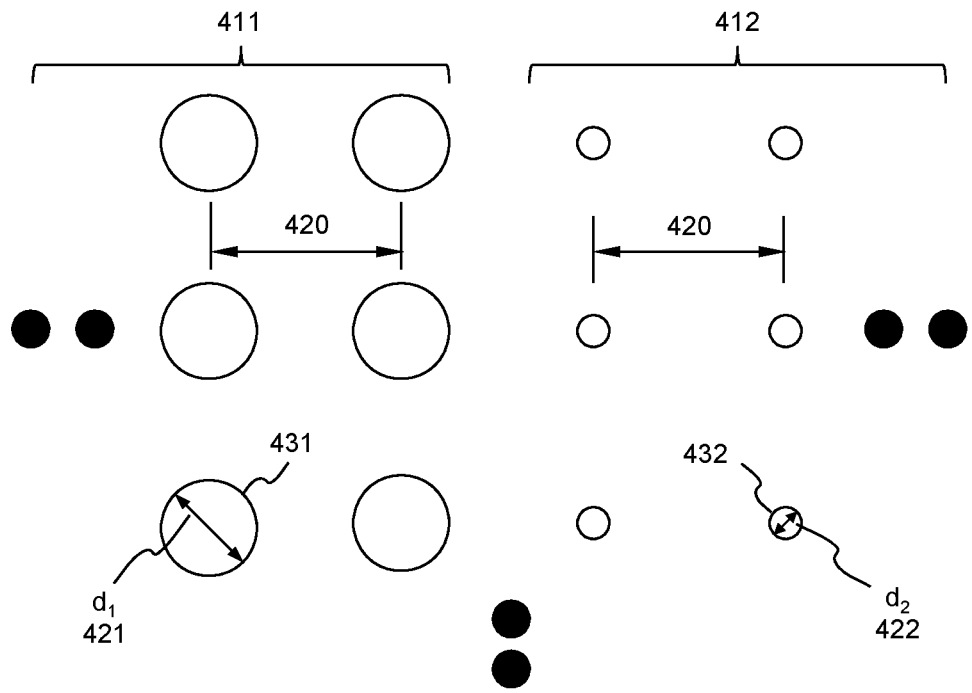
FIG. 4A is a plan view showing example first memory cells and example second memory cells with a same pitch, according to an embodiment of the invention.
Figure 4B:
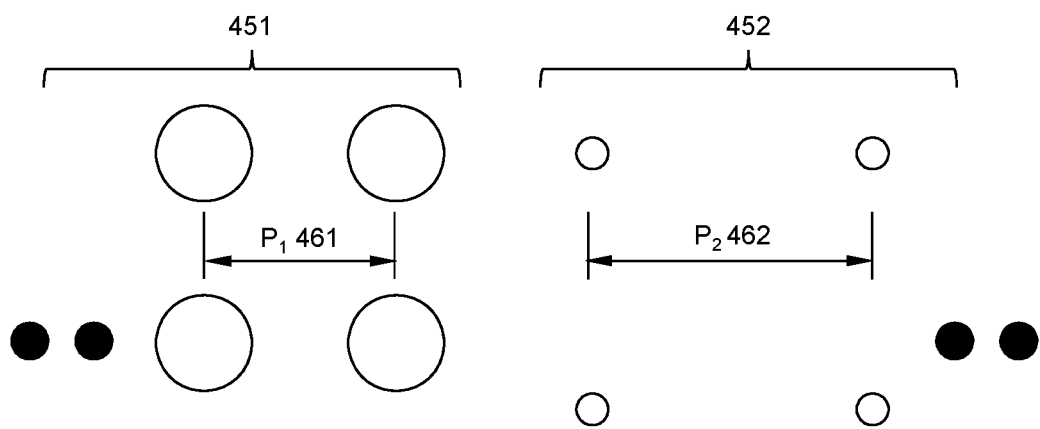
FIG. 4B is a plan view showing a portion of example first memory cells and example second memory cells with different pitches, according to an embodiment of the invention.

FIG. 4A is a plan view showing an example array of first STT-RAM cells 411 and an example array of second STT-RAM cells 412 with the same constant pitch 420. Pitch is the distance between two identical features on a semi-conductor substrate. Each of the first STT-RAM cells 411 contains a first magnetic tunnel junction (MTJ) element 431, which has a circular planar area with a first diameter (i.e., $d_1$ 421). Each of the second STT-RAM cells 412 contains a second MTJ element 432, whose circular planar area has a second diameter (i.e., $d_2$ 422). Generally the first diameter 411 is larger than the second diameter 412. Larger planar area of an MTJ element allows data be retained longer (e.g., 6 months or more). Smaller area of an MTJ element allows faster and balanced read/write with lower energy (e.g., less electric current).

In another embodiment, the pitch of the first STT-RAM cells are different from the pitch of the second STT-RAM cells. FIG. 4B is a plan view showing an example array of first STT-RAM cells 451 and an example array of second STT-RAM cells 452 with different pitches. The array of the first STT-RAM cells 451 has a first pitch $P_1$ 461 while the array of the second STT-RAM cells 452 has a second pitch $P_2$ 462. In this example shown in FIG. 4B, the second pitch 462 is greater than the first pitch 461. One of the reasons for larger pitch is to house a larger capacity transistor for providing higher electric current for controlling an MTJ element. Embodiments shown in FIGS. 4A-4B are for the first memory 212 or 251 for storing weights and for the second memory 214, 234 or 252 for storing input signals.

Figure 4C:
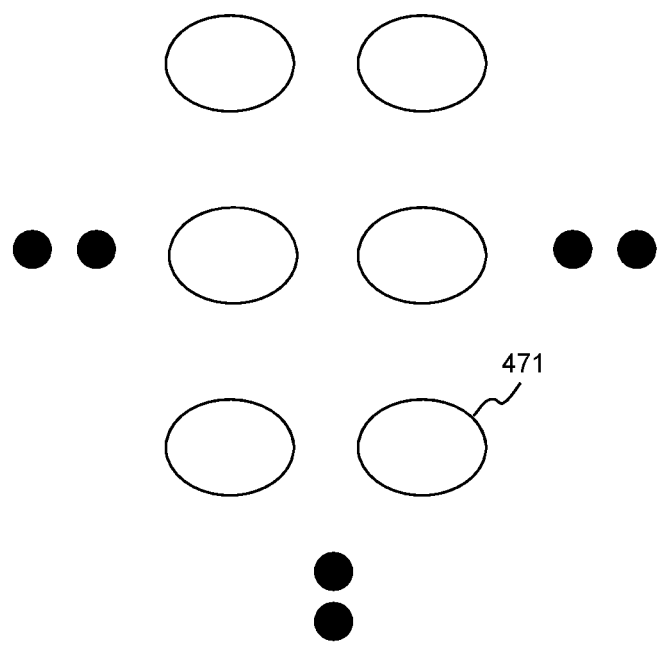
FIG. 4C is a plan view showing respective MTJ elements of an example array of OST-MRAM cells, according to an embodiment of the invention.

FIG. 4C shows an elliptical shape 471 of respective MTJ elements of an array of OST-MRAM cells.

Figure 5A:
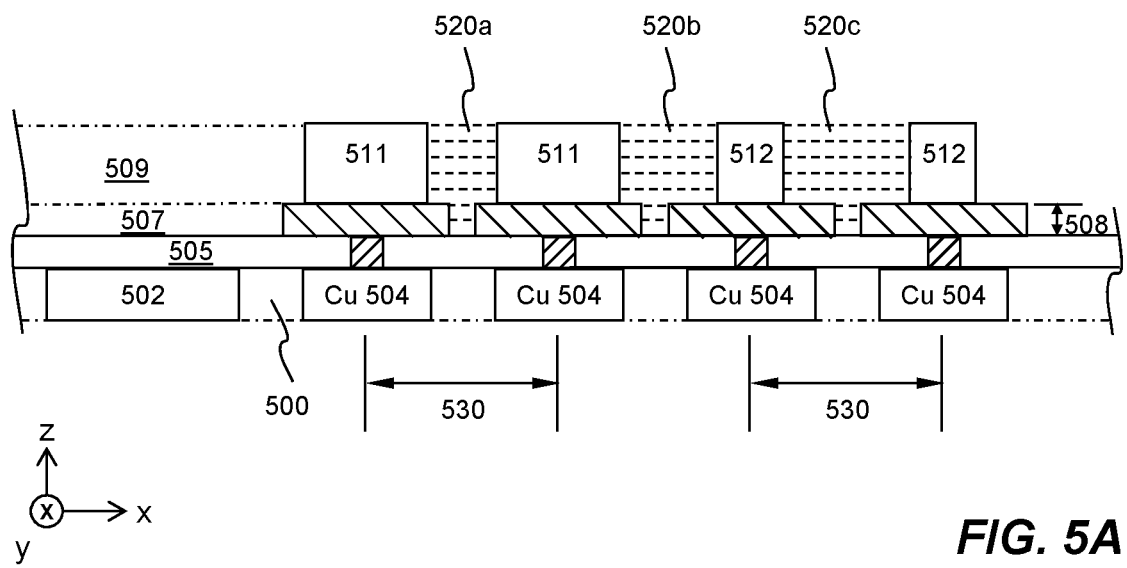
FIG. 5A is an elevation view showing relevant layers during fabrication of an array of example MTJ elements having constant pitch, according to an embodiment of the invention.
Figure 5B:
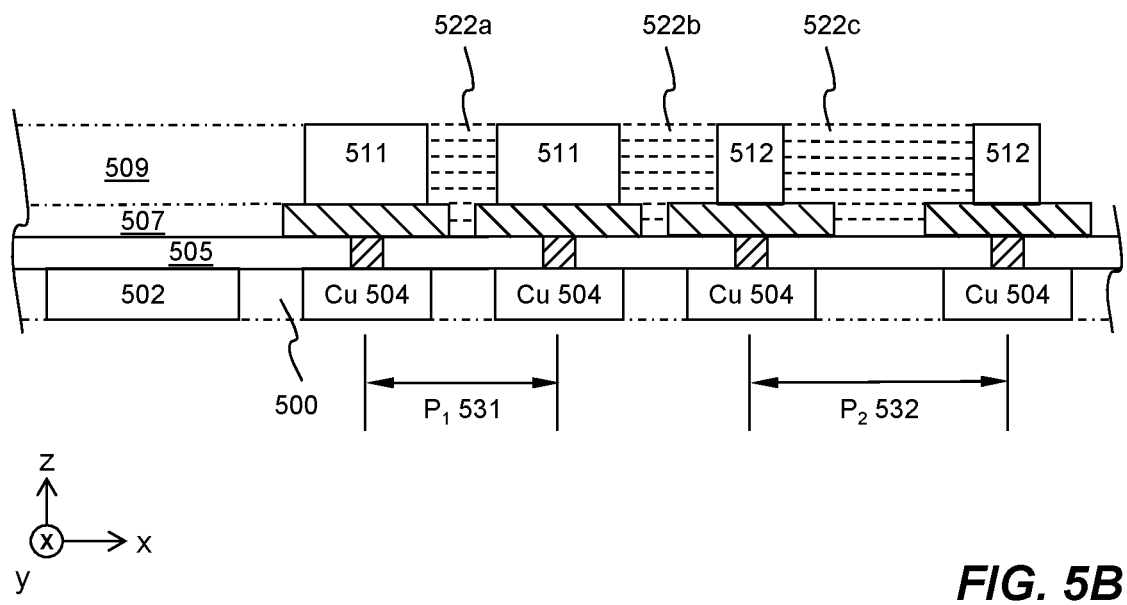
FIG. 5B is an elevation view showing relevant layers during fabrication of an array of example MTJ elements having different pitch, according to an embodiment of the invention.

The Cartesian coordinate system (x-y-z) in FIGS. 5A-5B shows that the vertical or "z" direction for thickness of each layer, while the "x-y" plane is the horizontal plane for each layer to be formed.

FIG. 5A is elevation view of first example layers of fabrication of MTJ elements with STT-RAM cells having a constant pitch 530. Metal layer or substrate 500 contains a plurality of copper landing pads 504 and metal lines for CNN logic circuits 502. Copper landing pads 504 correspond to transistors (not shown) for each of the first and the second STT-RAM cells. Forming on top of the metal layer 500 is a via layer 505. A high selectivity layer (HSL) 507 is formed on top of the via layer 505. HSL 507 has a thickness 508 in a range of 300-4000 Angstrom. Formed on top of the HSL 507 is an array of first MTJ elements 511 and an array of second MTJ elements 512. Only a few MTJs are shown for illustration simplicity and clarity. Unmasked portions 520a-520c are etched out thereafter.

Shown in FIG. 5B, another example layers showing STT-RAM cells having different pitches ($P_1$ 531 is smaller than $P_2$ 532). Having different pitch in the MTJ layers (i.e., first MTJ elements 511 and second MTJ elements 512), the unmasked portions 522a-522c are different. Larger pitch (e.g., $P_2$ 532) allows a larger transistor for providing higher current.

Figure 6A:
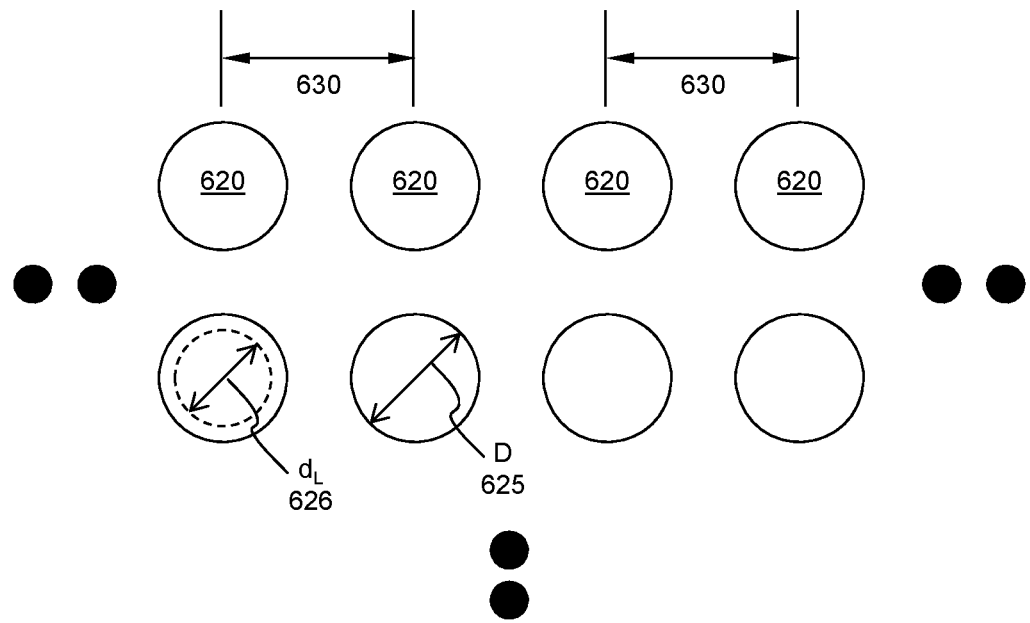
FIGS. 6A-6B are plan views showing respective high selectivity layers of FIG. 5A and FIG. 5B.
Figure 6B:
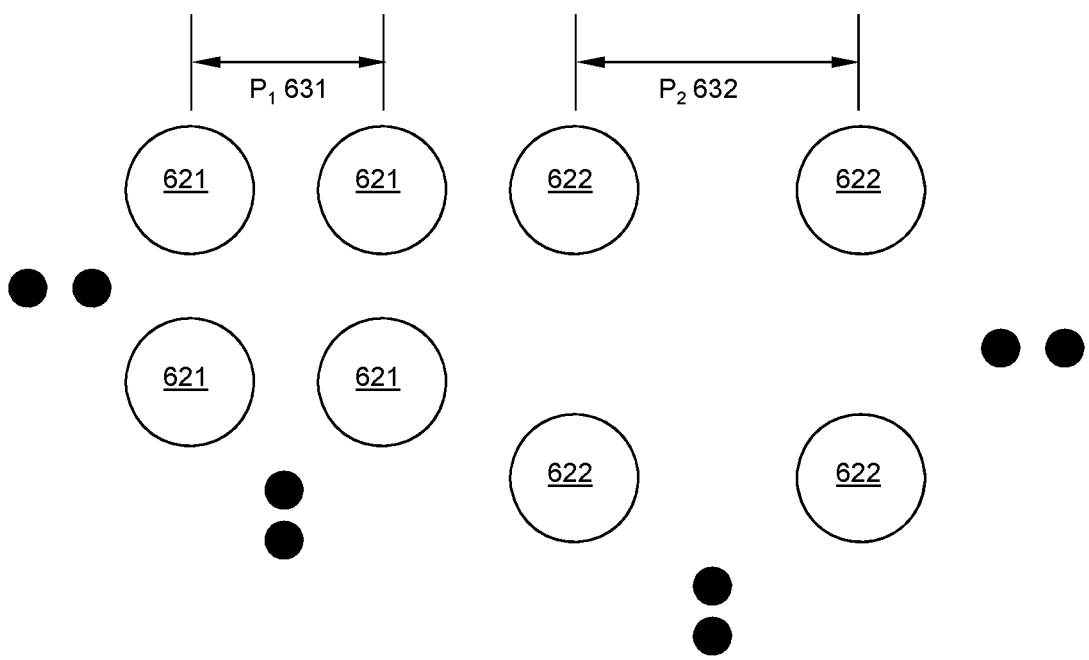

As a result, etching process of the unmasked portions 522a-522c require another layer (i.e., HSL 507 in form of high selectivity circular pads 620-622 shown in FIGS. 6A-6B) as an etching support such that the etching can be performed simultaneously for a smaller unmasked portion 522a and for a larger unmasked portion 522c.

Figure 7:
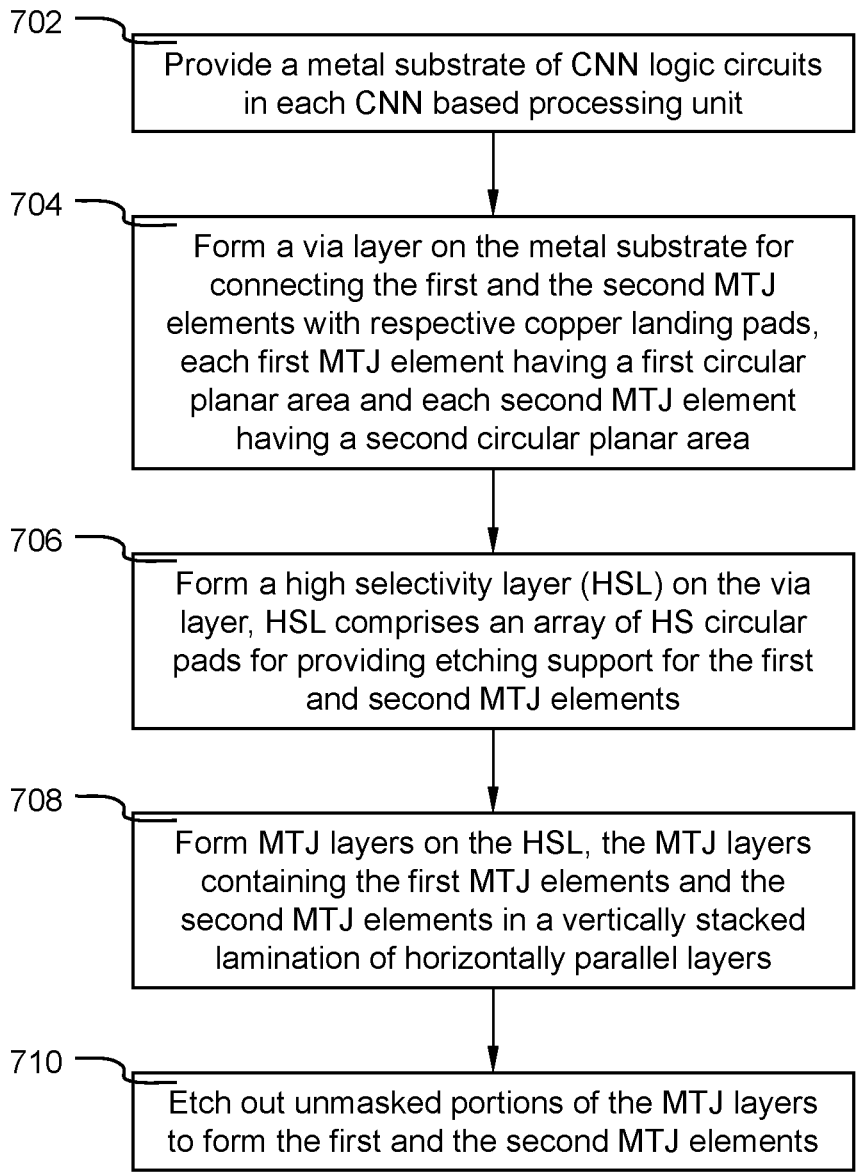
FIG. 7 is a flowchart illustrating an example process of fabricating an array of first magnetic tunnel junction (MTJ) elements and an array of second MTJ elements of an embedded memory subsystem in a CNN based IC for artificial intelligence, according to an embodiment of the invention.

FIG. 7 is a flowchart illustration an example process 700 of fabricating an array of first magnetic tunnel junction (MTJ) elements and an array of second MTJ elements of an embedded memory subsystem in a digital integrated circuit containing a plurality of CNN based processing units. Process 700 is understood with previous figures.

Process 700 starts at step 702 by providing a metal substrate 500 of CNN logic circuits in each CNN based processing unit and for all transistors for the first and the second STT-RAM cells. Next step 704, a via layer 505 is formed on the metal substrate for connecting the first MTJ elements 511 and the second MTJ elements 512 with respective copper landing pads 504. Each of the first MTJ elements 511 has a first circular planar area 431 and each of the second MTJ elements 512 has a second circular planar area 432. Then, at step 706, a high selectivity layer (HSL) 507 is formed on the via layer 505. HSL 507 contains an array of high selectivity circular pads 620 for providing etching support for forming the first and the MTJ elements 511-512. FIG. 6A shows a first example HSL containing an array of high selectivity circular pads 620 with constant or same pitch 630. In the second example HSL shown in FIG. 6B, there are two arrays of high selectivity circular pads 621-622. The first array has pitch $P_1$ 631 while the second array has pitch $P_2$ 632. Each high selectivity circular pad 620-622 has the area with a diameter D 625 equaling to 20-60 nm plus the larger of the two types of MTJ elements (i.e., $d_L$ 626 is the larger of $d_1$ 421 and $d_2$ 422 of FIG. 4A).

Next, at step 708, MTJ layers 509 are formed on the HSL. MTJ layers 509 contains the first MTJ elements 511 and the second MTJ elements 512 in a vertically stacked lamination of horizontally parallel layers (e.g., a bottom ferromagnetic layer 313, an oxide barrier layer 312 and a top ferromagnetic layer 311). Finally, at step 710, the unmasked portions 520a-520c, 522a-522c of the MTJ layers 509 are etched out and the first MTJ elements 511 and the second MTJ elements 512 are formed. The etching can be done with a number of techniques, for example, using a plasma process based on argon ions or other argon rich gases.

FIG. 8 is a table 800 summarizes relevant properties of a number of materials that can be used in high selectivity layer during fabrication of the memory subsystem in accordance with one embodiment. During etching operation of the MTJ layers, HSL is added for providing the support. In one embodiment, materials having a sputtering rate less than 90 can be used in the HSL. According to table 800, any one or any combination of Nb, Ta, Ti, TiN, W and Cr would fit the criterion. In other words, HSL can contain two layers of different materials, for example, TiN/Nb, TiN/Ti, TiN/W, TiN/Zr and the likes.

Although the invention has been described with reference to specific embodiments thereof, these embodiments are merely illustrative, and not restrictive of, the invention. Various modifications or changes to the specifically disclosed exemplary embodiments will be suggested to persons skilled in the art. For example, whereas image processing has been shown and described as an example usage of the CNN based digital IC, other applications may be used, for example, voice recognition. Sound waves can be recorded and converted into a series of digital images (e.g., using fast Fourier Transform), whose features in turn can be extracted using a CNN based digital IC. In summary, the scope of the invention should not be restricted to the specific exemplary embodiments disclosed herein, and all modifications that are readily suggested to those of ordinary skill in the art should be included within the spirit and purview of this application and scope of the appended claims.

What is claimed is:

1. A digital integrated circuit for artificial intelligence comprising:
   a semi-conductor substrate containing a plurality of cellular neural networks (CNN) processing units, each CNN processing unit comprising:
   CNN logic circuits; and
   a memory subsystem operatively coupled to the CNN logic circuits comprising:
   a first memory being configured for storing a set of weights that require higher retention rate than input signals;
   a second memory being configured for storing the input signals that require higher endurance of balanced data read and write operations than the first memory; and
   a third memory being configured for storing a one-time-programming unique data pattern written thereon for security purpose.

2. The digital integrated circuit of claim 1, wherein the first memory, the second memory and the third memory are each made of a plurality of magnetic random access memory cells with each cell includes a vertically orientated magnetic tunnel junction (MTJ) element containing an oxide barrier layer.

3. The digital integrated circuit of claim 2, wherein the one-time-programming unique data pattern is created by breaking down the oxide barrier layer of the MTJ element using at least one of a plurality of techniques.

4. The digital integrated circuit of claim 3, wherein a first technique comprises applying an electric voltage larger than a voltage range for normal read/write operations.

5. The digital integrated circuit of claim 3, wherein a second technique comprises applying a longer duty cycle of electric current than normal read/write time.

6. The digital integrated circuit of claim 3, wherein a third technique comprises setting a different area of the MTJ element, whereby a smaller area allows easier break-down of the oxide barrier layer.

7. The digital integrated circuit of claim 3, wherein a fourth technique comprises setting a different gate length of transistor, whereby a larger transistor allows larger electric current to break down the oxide barrier layer.

8. The digital integrated circuit of claim 2, wherein said each magnetic random access memory cell comprises a spin transfer torque magnetic random access memory (STT-RAM) cell.

9. The digital integrated circuit of claim 2, wherein the MTJ element of the STT-RAM has a circular planar area with a diameter in a range of 20-150 nm (nanometers).

10. The digital integrated circuit of claim 2, wherein said each magnetic random access memory cell comprises an orthogonal spin transfer magnetic random access memory (OST-MRAM) cell.

* * * * *